US007336144B2

(12) United States Patent
Lee et al.

(10) Patent No.: US 7,336,144 B2
(45) Date of Patent: Feb. 26, 2008

(54) COMPACT MULTILAYER BAND-PASS FILTER AND METHOD USING INTERDIGITAL CAPACITOR

(75) Inventors: Seong-soo Lee, Suwon-si (KR); Jin-soo Park, Yongin-si (KR); Yong-jun Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 122 days.

(21) Appl. No.: 11/055,115

(22) Filed: Feb. 11, 2005

(65) Prior Publication Data

US 2005/0200436 A1 Sep. 15, 2005

(30) Foreign Application Priority Data

Feb. 14, 2004 (KR) ...................... 10-2004-0009851

(51) Int. Cl.
*H03H 7/00* (2006.01)
*H01P 1/20* (2006.01)
*H01P 3/08* (2006.01)

(52) U.S. Cl. ........................ 333/204; 333/184; 333/185

(58) Field of Classification Search ................ 333/204, 333/185, 175, 177, 184

See application file for complete search history.

(56) References Cited

U.S. PATENT DOCUMENTS

| | | | | |
|---|---|---|---|---|
| 4,963,843 | A | 10/1990 | Peckham | |
| 6,759,926 | B2 * | 7/2004 | Yamaguchi | 333/175 |
| 6,762,659 | B2 | 7/2004 | Son et al. | |
| 7,095,301 | B2 * | 8/2006 | Hidaka et al. | 333/219 |

FOREIGN PATENT DOCUMENTS

| | | |
|---|---|---|
| KR | 1020010094784 A | 3/2001 |

* cited by examiner

*Primary Examiner*—Robert Pascal
*Assistant Examiner*—Kimberly E Glenn
(74) *Attorney, Agent, or Firm*—Staas & Halsey LLP

(57) ABSTRACT

A compact multilayer band-pass filter using an interdigital capacitor which can be integrated into a compact form in a relatively low frequency band. The band-pass filter filters only a signal of a predetermined frequency band from a signal applied through an input terminal, and outputs a filtered signal to an output terminal. The band-pass filter includes at least one pair of transmission lines, respectively formed between the input terminal and the output terminal provided on an uppermost layer, for generating an inductor component, a capacitance compensation unit, with the interdigital capacitor having a plurality of layers, for loading a specified capacitance to one end of the transmission line, and a ground layer coupled to a specified layer of the capacitance compensation unit and the other end of the transmission line and formed on a lowermost layer.

18 Claims, 4 Drawing Sheets

COMPACT MULTILAYER BAND-PASS FILTER AND METHOD USING INTERDIGITAL CAPACITOR

CROSS-REFERENCE TO RELATED APPLICATIONS

This application claims benefit under 35 U.S.C. § 119 from Korean Patent Application No. 2004-9851, filed on Feb. 14, 2004, the entire content of which is incorporated herein by reference.

BACKGROUND OF THE INVENTION

1. Field of the Invention

The present invention relates to a band-pass filter and method using a transmission line therefor, and more particularly to a compact band-pass filter which can be completely integrated and implemented using a multilayer interdigital capacitor as a capacitor compensation circuit.

2. Description of the Related Art

With the spread of wireless mobile communications, existing frequency resources are becoming saturated, resulting in higher and higher frequency bands being additionally used. This has caused an increase in demand for band-pass filters which can be used in higher-frequency bands. In the field of wireless communication equipment, such as cellular phones or a wireless LANs, size and cost are of great concern, and thus diverse techniques for reducing the size and cost have been developed.

Specifically, in order to reduce the size of a product, a structure using transmission lines that can be implemented in small spaces has been used instead of a lumped passive element which would occupy a large space. Its representative example would be a band-pass filter implemented by transmission lines, used for the purpose of extracting only a signal of a desired frequency band and intercepting other noise signals. This band-pass filter has been used in diverse fields, including in wireless communication systems. In a wireless communication system, the band-pass filter has been used to receive or transmit only a desired signal in a transmitter or a receiver.

A filter implemented by use of a stripline, which is a type of transmission line, is disclosed in U.S. Pat. No. 4,963,843, issued to Motorola, Inc. on Oct. 16,1990. With reference to those described in U.S. Pat. No. 4,963,843, a conventionally proposed combline stripline filter will be explained.

The conventional combline stripline filter includes conductive strips. One end of the conductive strip is connected to ground, and the other end thereof is loaded to ground so as to have a capacitance. That is, in a substrate having an uppermost surface and a lowermost surface that constitute the combline stripline filter, the uppermost surface and the lowermost surface are ground surfaces. Meanwhile, an inner circuitry layer is formed between the uppermost surface and the lowermost surface. A ground area has angled edges formed by a predetermined number of substrate surfaces crossing one another, and is coupled to ground planes. One end of the combline resonator, which corresponds to the inner circuitry layer, is coupled to the ground planes, and the other end thereof is coupled to the ground area so as to have a capacitance. However, the above-described combline stripline filter includes drawbacks of having a complicated structure and large size, while further requiring input/output ports being provided through via-holes.

Another example of a filter using the above-described transmission lines and a combline structure is disclosed in U.S. Pat. No. 6,762,659. This patent proposes a wireless filter of a combline structure which has a capacitor compensation circuit that connects respective layers constituting a multilayer structure through via-holes. In this case, the wireless filter of the combline structure has a capacitor compensation circuit, provided with a capacitor of a lumped element, as a capacitance compensation unit.

In the above-described structure, a parasitic effect generated in the connection part of the lumped element and the transmission line increases as the frequency band becomes heightened, and therefore, it may be difficult to implement. Since the lumped element should be attached to the transmission line by surface mounting, an additional packaging cost is also incurred, as well as its manufacturing process being complicated.

Although filters implemented by use of transmission lines have been used in many wireless mobile communication modules, due to its good integration, their size is dependent on the frequency band. In particular, in a C-band, which is used as the frequency band for Bluetooth devices or wireless LANs, the size of the filter is relatively large, and thus a scheme for reducing the size is required.

SUMMARY OF THE INVENTION

Embodiments of the present invention have been developed in order to solve the above drawbacks and other problems associated with the conventional filter arrangements. An aspect of the present invention is to provide a band-pass filter which can be integrated into a compact form, in a relatively low frequency band, by using an interdigital capacitor having a multilayer structure where multiple layers are connected through via-holes.

Additional aspects and/or advantages of the invention will be set forth in part in the description which follows and, in part, will be obvious from the description, or may be learned by practice of the invention.

To achieve the above and/or other aspects and advantages, embodiments of the present invention set forth a band-pass filter using an interdigital capacitor of a multilayer structure which filters only a signal of a predetermined frequency band from a signal applied through an input terminal and outputs a filtered signal to an output terminal, including at least one pair of transmission lines, formed between the input terminal and the output terminal provided on an uppermost layer of the multilayer structure, for generating an inductor component, a capacitance compensation unit including the interdigital capacitor having a plurality of layers, for loading a specified capacitance to one end of at least one of the transmission lines, and a ground layer coupled to a specified layer of the capacitance compensation unit and another end of at least the one transmission line and formed on a lowermost layer.

The interdigital capacitor may include a combline structure that provides the specified capacitance so that a length of at least the one transmission line becomes electrically half a wavelength of a center frequency of a signal output from the output terminal. In addition, the band-pass filter may further include a plurality of via-holes connecting at least one electrode plate to the ground layer for forming at least the one transmission line and the interdigital capacitor. In addition, the via-holes form the interdigital capacitor, and interconnect at least two specified electrode plates which are not connected to the ground layer. The at least one transmission line may also be either a stripline or a microstripline.

To achieve the above and/or other aspects and advantages, embodiments of the present invention set forth a band-pass filter using an interdigital capacitor of a multilayer structure which filters only a signal of a predetermined frequency band from a signal applied through an input terminal and outputs a filtered signal to an output terminal, including at least one pair of transmission lines, formed between the input terminal and the output terminal for generating an inductor component, a capacitance compensation unit including the interdigital capacitor having a plurality of layers for loading a specified capacitance to one end of at least one of the transmission lines such that an electrical length of the at least one transmission line corresponds to less than a wavelength of a center frequency of the predetermined frequency band.

The electrical length may correspond to half a wavelength of the center frequency of the predetermined frequency band, and/or a length of the at least one transmission line may become electrically half a wavelength of a center frequency of the signal output from the output terminal. The band-pass filter may further include a ground layer coupled to a specified layer of the capacitance compensation unit and another end of at least the one transmission line and formed on a lowermost layer.

To achieve the above and/or other aspects and advantages, embodiments of the present invention set forth a band-pass filtering method filtering a predetermined frequency band, including generating an inductor through at least one pair of transmission lines, formed between an input terminal and the output terminal provided on an uppermost layer of a corresponding multilayer structure, loading a specified capacitance to one end of at least one of the transmission lines a through a plurality of layers of the multi-layer structure, and coupling a ground to a specified layer of the multi-layer structure.

The method may further include providing the specified capacitance so that a length of at least the one transmission line becomes electrically half a wavelength of a center frequency of a signal output from the output terminal. The method may also include connecting at least one electrode plate to the ground, through a plurality of via-holes, for forming the at least the one transmission line. The via-holes may form an interdigital capacitor, and interconnect at least two specified electrode plates which are not directly connected to the ground.

To achieve the above and/or other aspects and advantages, embodiments of the present invention set forth a band-pass filtering method filtering a predetermined frequency band, including generating an inductor with at least one pair of transmission lines, loading a specified capacitance to one end of at least one of the transmission lines such that an electrical length, through a multi-layer structure, of the at least one transmission line corresponds to less than a wavelength of a center frequency of the predetermined frequency band to output a filtered signal.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
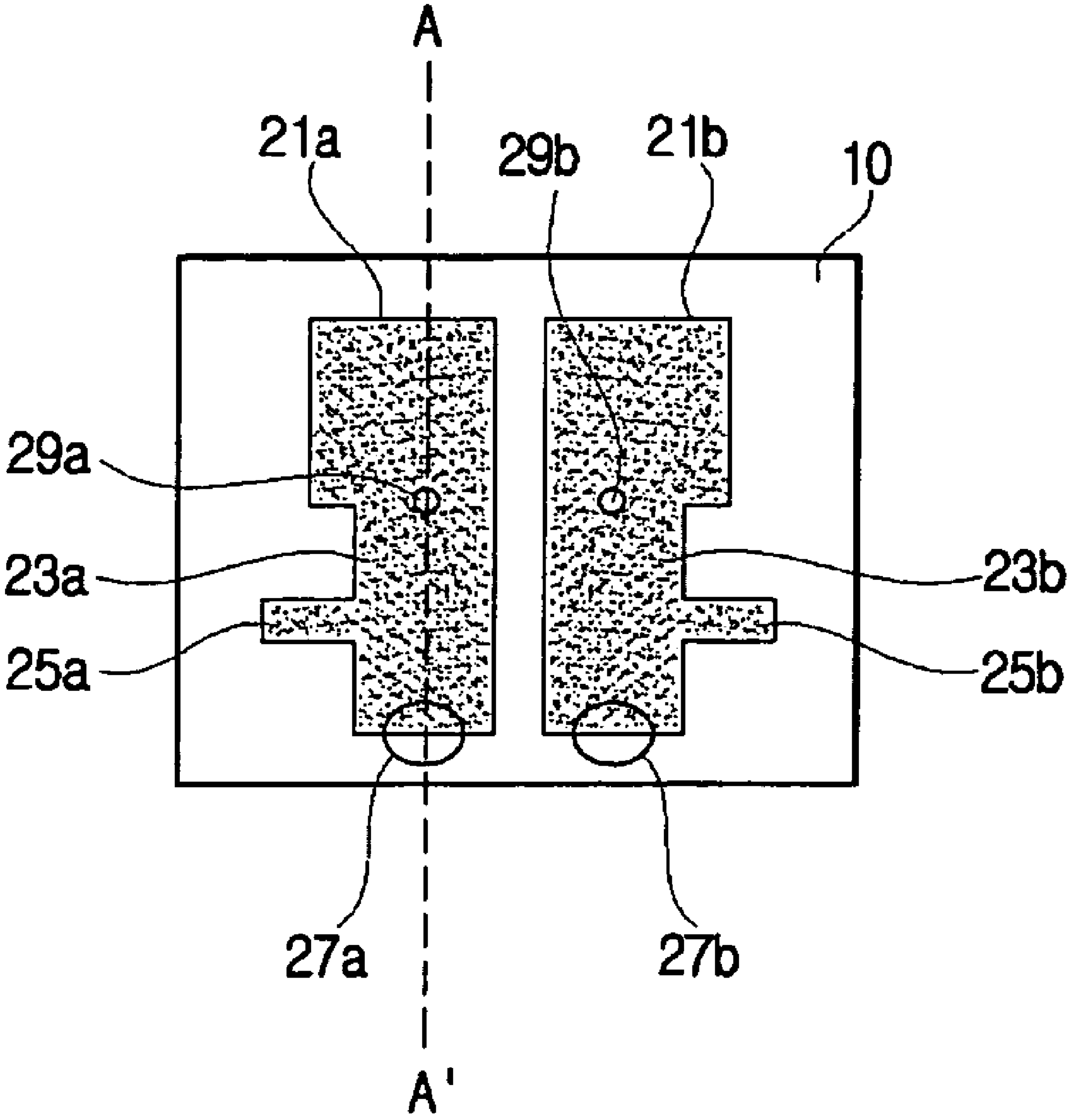
FIG. 1 is a plane view illustrating the structure of a band-pass filter, according to an embodiment of the present invention.

Reference will now be made in detail to embodiments of the present invention, examples of which are illustrated in the accompanying drawings, wherein like reference numerals refer to like elements throughout. The embodiments are described below to explain the present invention by referring to the figures.

The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Embodiments of the present invention relates to a band-pass filter implemented by use of transmission lines. The transmission lines can generally be divided into striplines or micro-striplines, and the band-pass filter according to an embodiment of the present invention may be implemented by use of such striplines and micro-striplines. Hereinafter, embodiments of the present invention will be explained with reference to a band-pass filter using the micro-stripline.

Figure 2:
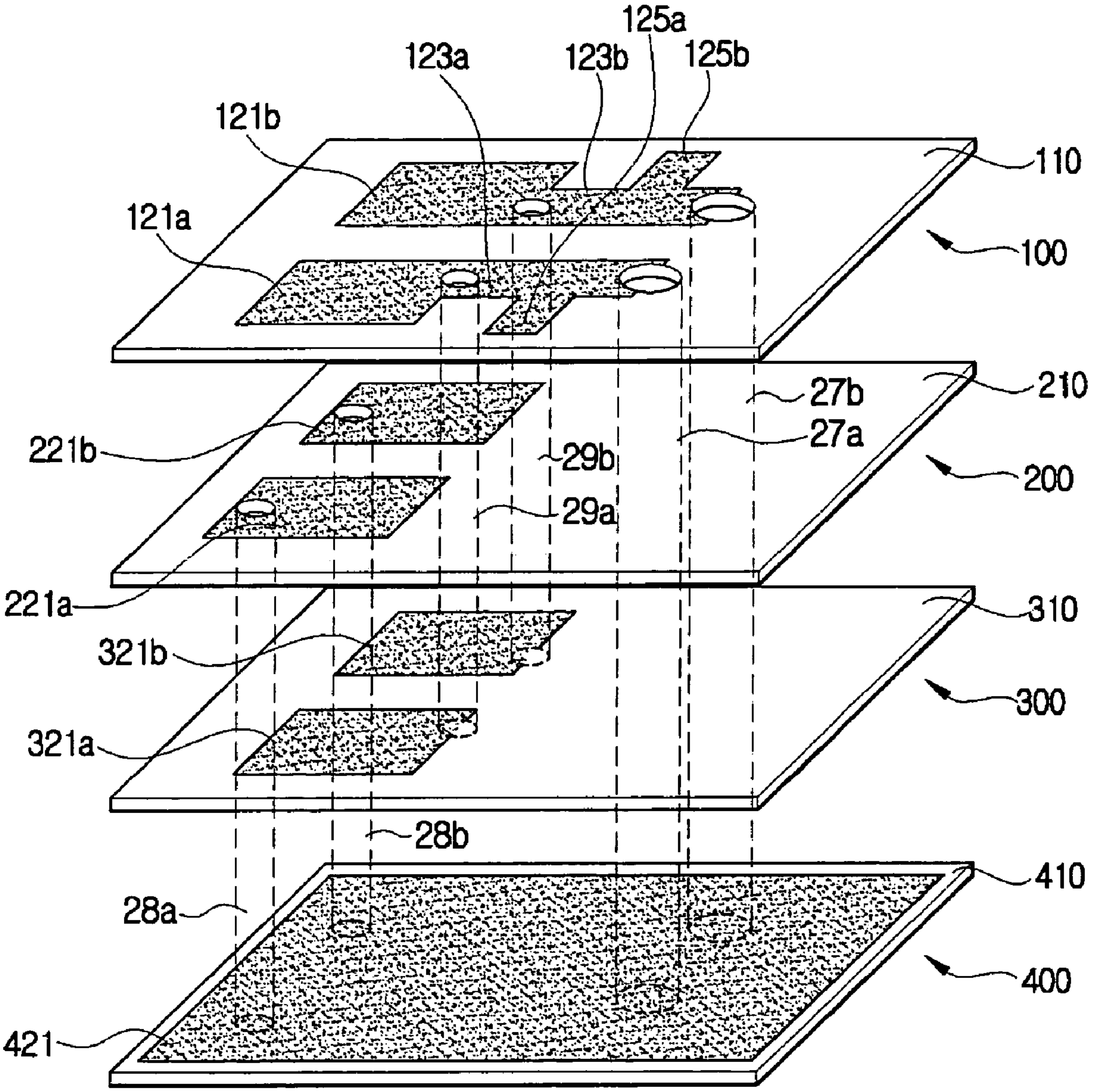
FIG. 2 is a perspective view of the band-pass filter illustrated in FIG. 1.

FIG. 1 is a plane view illustrating the structure of a band-pass filter, according to an embodiment of the present invention. FIG. 2 is a perspective view of the band-pass filter illustrated in FIG. 1, and FIG. 3 is a sectional view of the band-pass filter illustrated in FIG. 1.

Referring to FIG. 1, the band-pass filter includes a pair of micro-striplines 23*a* and 23*b*, which are connected to an input terminal 25*a* and an output terminal 25*b*, respectively, generating an inductor component, and interdigital capacitors 21*a* and 21*b* having a multilayer structure which loads a specified capacitance to the micro-striplines 23*a* and 23*b*. Respective layers of the band-pass filter are connected through via-holes 27*a*, 27*b*, 29*a* and 29*b*.

The capacitance of the interdigital capacitor 21*a* and 21*b* is based on the frequency band to be filtered and a size of the filter to be implemented. The micro-striplines 23*a* and 23*b* must have a length “electrically” corresponding to half a wavelength of the frequency band to be filtered. In this case, by loading the capacitance to edges of the micro-striplines 23*a* and 23*b*, its physical length can be shortened, while its electrical length lengthened, so that a relatively small-sized band-pass filter can be implemented. Since the electrical length of the micro-striplines 23*a* and 23*b* is lengthened as the value of the capacitance loaded to the micro-striplines 23*a* and 23*b* becomes larger, it is possible to implement a band-pass filter having a smaller size.

Figure 3:
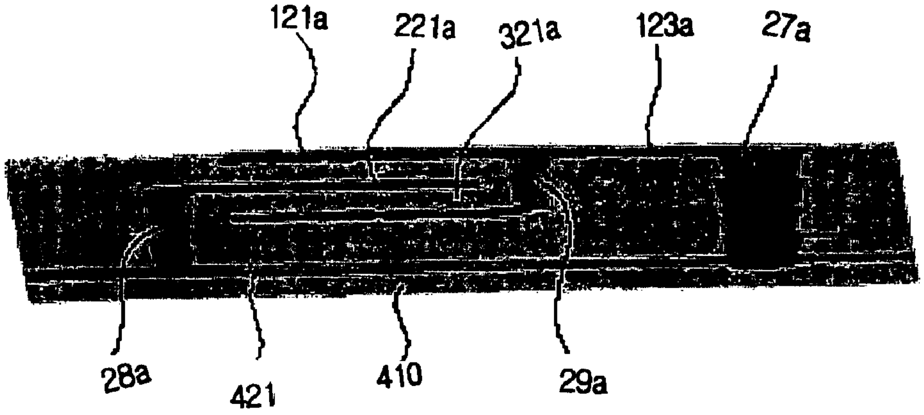
FIG. 3 is a sectional view of the band-pass filter illustrated in FIG. 1.

Referring to FIGS. 2 and 3, the band-pass filter can include dielectric layers 110, 210, 310 and 410, made of low temperature co-fired ceramic, and four metal layers 100, 200, 300 and 400, formed on the dielectric layers 110, 210, 310 and 410, respectively, with a specified pattern.

On the dielectric layer 110 of the uppermost layer 100, an input terminal 125*a* and an output terminal 125*b* are formed as specified metal layers, a pair of micro-striplines 123*a* and 123*b* are connected to the input and output terminals 125*a* and 125*b*, respectively, and first electrode plates 121*a* and 121*b* are connected to edges of the micro-striplines 123*a* and

123*b* to form the interdigital capacitor 21*a* and 21*b*. These can be formed by a semiconductor process.

On the second layer 200 and the third layer 300, second electrode plates 221*a* and 221*b* and third electrode plates 321*a* and 321*b*, having patterns corresponding to those of the first electrode plates 121*a* and 121*b*, are formed, and on the lowermost layer 400, a ground electrode 421 is formed.

Here, the micro-striplines 123*a* and 123*b* of the uppermost layer 100 are connected to the ground electrode 421 of the lowermost layer 400 through via-holes 27*a* and 27*b*. The second electrode plates 221*a* and 221*b* are connected to the ground electrode 421 through via-holes 28*a* and 28*b*, and the third electrode plates 321*a* and 321*b* are connected to the first electrode plates 121*a* and 121*b* through via-holes 29*a* and 29*b*, so that the interdigital capacitor 21*a* and 21*b* (of FIG. 1), having a multilayer structure, is implemented. By increasing the number of layers of the interdigital capacitor 21*a* and 21*b*, a larger amount of capacitance can be obtained from the same area.

As described above, a very small-sized band-pass filter can be implemented using the interdigital type capacitor of a four-layer structure, provided on the low temperature co-fired ceramic substrate. In an embodiment of the present invention, the dimensions of the implemented filter were 2.7 mm, 2.03 mm and 0.4 mm in width, length and height.

Figure 4:
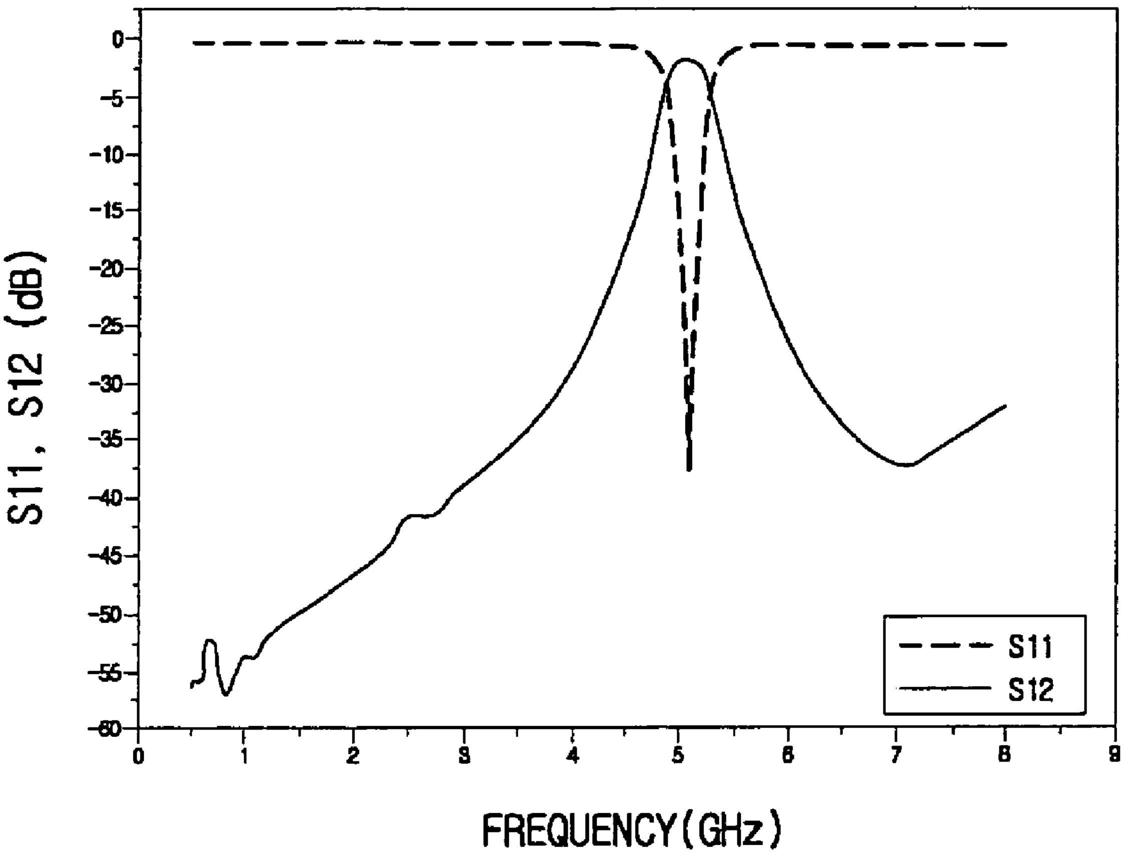
FIG. 4 is a graph illustrating characteristics of a band-pass filter, according to an embodiment of the present invention.

FIG. 4 is a graph illustrating characteristics of a band-pass filter, according to an embodiment of the present invention. The graph of FIG. 4 is based on the measuring of the performance of a band-pass filter implemented according to an embodiment of the present invention, e.g., using a Wiltron 360B network analyzer and an air coplanar probe tip of a G-S-G (Ground-Signal-Ground) type manufactured by Microtech and having a pitch of 500 μm. Referring to FIG. 4, based on the result of these measurements, an insertion loss of 1.8 dB and a reflection loss of 37.6 dB at a center frequency of 5.09 GHz, and the characteristic of a bandwidth of 280 MHz was obtained. In FIG. 4, S11 indicates a strength ratio of a signal reflected from the input terminals 25*a* and 125*a* to a signal input to the input terminals 25*a* and 125*a*, i.e., a reflection loss, and S12 indicates a strength ratio of a signal passing through the input terminals 25*a* and 125*a* to a signal input to the output terminals 25*b* and 125*b*, i.e., a insertion loss.

As described above, according to embodiments of the present invention, an interdigital capacitor of a multilayer structure can be implemented to obtain a large amount of capacitance with a relatively small size. Accordingly, using this capacitor, a compact band-pass filter can be implemented.

The band-pass filter using an interdigital capacitor of a multilayer structure, according to embodiments of the present invention, can be easily and completely integrated into a substrate having a general multilayer structure. That is, this band-pass filter can be easily implemented on not only on a general multilayer printed circuit board but also on a low temperature co-fired ceramic board at low cost. Since the band-pass filter according to embodiments of the present invention has a small size and a simple structure, and can be completely integrated into a substrate, it can be applied to various kinds of wireless communication modules.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

Thus, although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A band-pass filter using an interdigital capacitor of a multilayer structure which filters only a second signal of a predetermined frequency band from a first signal applied through an input terminal and outputs the filtered second signal to an output terminal, comprising:

at least one pair of transmission lines, formed between the input terminal and the output terminal provided on an uppermost layer of the multilayer structure, for generating an inductor component;

a capacitance compensation unit comprising the interdigital capacitor having a plurality of layers, for loading a specified capacitance to one end of at least one of the transmission lines; and a ground layer coupled to a specified layer of the capacitance compensation unit and another end of at least the one transmission line and formed on a lowermost layer.

2. The band-pass filter of claim 1, wherein the interdigital capacitor provides the specified capacitance so that a length of at least the one transmission line becomes electrically half a wavelength of a center frequency of the filtered second signal output from the output terminal.

3. The band-pass filter of claim 1, further comprising a plurality of via-holes connecting at least one electrode plate to the ground layer for forming at least the one transmission line and the interdigital capacitor, wherein the at least one electrode plate is connected to at least one of the pair of transmission lines.

4. The band-pass filter of claim 3, wherein the via-holes form the interdigital capacitor, and interconnect at least two specified electrode plates each respectivelv connected to the pair of transmission lines.

5. The band-pass filter of claim 1, wherein the at least one transmission line is either a stripline or a micro-stripline.

6. A band-pass filter using an interdigital capacitor of a multilayer structure which filters only a second signal of a predetermined frequency band from a first signal applied through an input terminal and outputs the filtered second signal to an output terminal, comprising:

at least one pair of transmission lines, formed between the input terminal and the output terminal for generating an inductor component;

a capacitance compensation unit comprising the interdigital capacitor having a plurality of layers for loading a specified capacitance to one end of at least one of the transmission lines such that an electrical length of the at least one transmission line corresponds to less than a wavelength of a center frequency of the predetermined frequency band.

7. The band-pass filter of claim 6, wherein the electrical length corresponds to half a wavelength of the center frequency of the predetermined frequency band.

8. The band-pass filter of claim 6, wherein the electrical length of the at least one transmission line becomes electrically half a wavelength of a center frequency of the filtered second signal output from the output terminal.

9. The band-pass filter of claim 6, further comprising a ground layer coupled to a specified layer of the capacitance compensation unit and another end of at least the one transmission line and formed on a lowermost layer.

10. A band-pass filtering method filtering a predetermined frequency band, comprising:

generating an inductor through at least one pair of transmission lines, formed between an input terminal and an output terminal provided on an uppermost layer of a corresponding multilayer structure;

loading a specified capacitance to one end of at least one of the transmission lines through an interdigital capacitor having a plurality of layers of the multi-layer structure; and coupling a ground to a specified layer of the multi-layer structure.

11. The method of claim 10, further comprising providing the specified capacitance so that a length of at least the one transmission line becomes electrically half a wavelength of a center frequency of a signal output from the output terminal.

12. The method of claim 10, further comprising connecting at least one electrode plate to the ground, through a plurality of via-holes, for forming the at least the one transmission line, wherein the at least one electrode plate is connected to at least one of the pair of transmission lines.

13. The method of claim 12, wherein the via-holes form the interdigital capacitor, and interconnect at least two specified electrode plates each respectively connected to the pair of transmission lines.

14. The method of claim 10, wherein the at least one transmission line is either a stripline or a micro-stripline.

15. A band-pass filtering method filtering a predetermined frequency band, comprising:

generating an inductor with at least one pair of transmission lines;

loading a specified capacitance to one end of at least one of the transmission lines, through an interdigital capacitor having a plurality of layers of a multi-layer structure, such that an electrical length of the at least one transmission line corresponds to less than a wavelength of a center frequency of the predetermined frequency band to output a filtered signal.

16. The method of claim 15, wherein the electrical length corresponds to half a wavelength of the center frequency of the predetermined frequency band.

17. The method of claim 15, wherein the electrical length of the at least one transmission line becomes electrically half a wavelength of a center frequency of the output filtered signal.

18. The method of claim 15, further comprising coupling a ground to a specified layer of the multi-layer structure.

* * * * *

UNITED STATES PATENT AND TRADEMARK OFFICE

CERTIFICATE OF CORRECTION

PATENT NO. : 7,336,144 B2
APPLICATION NO. : 11/055115
DATED : February 26, 2008
INVENTOR(S) : Seong-soo Lee et al.

It is certified that error appears in the above-identified patent and that said Letters Patent is hereby corrected as shown below:

Column 6, Line 43 Claim 4, change “respectivelv” to --respectively--.

Signed and Sealed this

Twenty-ninth Day of July, 2008

JON W. DUDAS
*Director of the United States Patent and Trademark Office*